US008471369B1

(12) United States Patent
McCulloh et al.

(10) Patent No.: US 8,471,369 B1
(45) Date of Patent: Jun. 25, 2013

(54) METHOD AND APPARATUS FOR REDUCING PLASMA PROCESS INDUCED DAMAGE IN INTEGRATED CIRCUITS

(75) Inventors: Heather McCulloh, Kennebunk, ME (US); Denis Finbarr O'Connell, Palo Alto, CA (US); Sergei Drizlikh, Scarborough, ME (US); Douglas Brisbin, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1325 days.

(21) Appl. No.: 10/912,660

(22) Filed: Aug. 5, 2004

Related U.S. Application Data

(60) Provisional application No. 60/571,847, filed on May 17, 2004.

(51) Int. Cl.
*H01L 23/58* (2006.01)
(52) U.S. Cl.
USPC ............... 257/639; 257/649; 257/E21.267; 257/E23.167; 438/637; 438/786
(58) Field of Classification Search
USPC ............ 257/337, 338, 368, 369, 629, 632, 257/635, 637, 639, 640, 649, E21.243, E21.247, 257/E21.249, E23.167; 438/622, 624, 637, 438/783, 786
See application file for complete search history.

(56) References Cited

U.S. PATENT DOCUMENTS

| 5,897,372 | A  | * | 4/1999  | Howard ........................ 438/637 |
| 6,235,653 | B1 | * | 5/2001  | Chien et al. .................. 438/788 |
| 6,746,914 | B2 | * | 6/2004  | Kai et al. ..................... 438/253 |
| 2001/0046760 | A1 | * | 11/2001 | Chatterjee et al. ............ 438/585 |
| 2004/0108539 | A1 | * | 6/2004  | Kim ............................. 257/314 |
| 2004/0175926 | A1 | * | 9/2004  | Wang et al. .................. 438/627 |
| 2004/0178419 | A1 | * | 9/2004  | Song ............................ 257/103 |
| 2005/0035460 | A1 | * | 2/2005  | Tseng .......................... 257/760 |
| 2005/0221554 | A1 | * | 10/2005 | Huang ......................... 438/233 |

OTHER PUBLICATIONS

T. C. Ang et al., "High Density Plasma FSG Charging Damage", In Process Control and Diagnostics, Proceedings of SPIE vol. 4182 (2000), pp. 151-158.
Seung-Chul Song et al., "Avoiding Plasma Induced Damage to Gate Oxide with Conductive Top Film (CTF) on PECVD Contact Etch Stop Layer", 2002 Symposium on VLSI Technology Digest of Technical Papers, 2002 IEEE, pp. 72-73.
Susumu Shuto et al., "UV-Blocking Technology to Reduce Plasma-Induced Transistor Damage in Ferroelectric Devices with Low Hydrogen Resistance", IEEE 37th Annual International Reliability Physics Symposium, San Diego, California, 1999, pp. 356-361.
Gyeong S. Hwang et al., "Mechanism of Charging Damage During Interlevel Oxide Deposition in High-Density Plasma Tools", 1998 3rd International Symposium on Plasma Process-Induced Damage, pp. 164-167.

* cited by examiner

*Primary Examiner* — William D Coleman
*Assistant Examiner* — Su Kim
(74) *Attorney, Agent, or Firm* — Eugene C. Conser; Wade J. Brady, III; Frederick J. Telecky, Jr.

(57) ABSTRACT

An insulating material interposed between two conductive materials can experience plasma process induced damage (PPID) when a plasma process is used to deposit a dielectric onto one of the conductive materials. This PPID can be reduced by reducing electric charge accumulation on the one conductive material during the plasma process dielectric deposition.

4 Claims, 3 Drawing Sheets

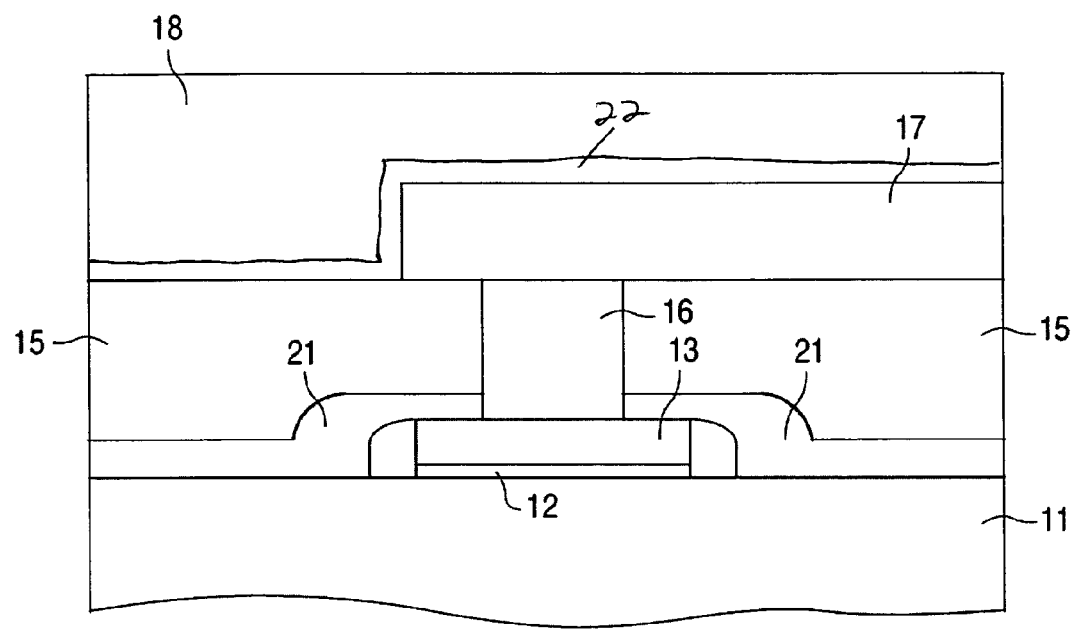
FIG. 2$\beta$

METHOD AND APPARATUS FOR REDUCING PLASMA PROCESS INDUCED DAMAGE IN INTEGRATED CIRCUITS

This application claims the priority under 35 U.S.C. §119 (e)(1) of provisional application Ser. No. 60/571,847 filed on May 17, 2004 and incorporated herein by reference.

TECHNICAL FIELD OF THE INVENTION

The present invention relates generally to fabrication of integrated circuits and, more particularly, to integrated circuit fabrication using a plasma process.

BACKGROUND OF THE INVENTION

Plasma processes are commonly used to produce intermetal dielectric (IMD) layers to reduce the RC delay in the interconnects that connect metal layers in integrated circuits. For example, a high-density plasma oxide such as a fluorine doped high-density plasma (FHDP) oxide is commonly used as an IMD layer to reduce the RC delay in sub-0.18 micron aluminum interconnects. An example of this is illustrated in FIG. 1, wherein an FHDP oxide is provided as an IMD layer 18 between a metal layer 17 and an upper metal layer (not explicitly shown). As mentioned above, the IMD layer 18 can reduce the RC delay in interconnects (not explicitly shown) that connect the metal layer 17 to upper metal layers. Also in FIG. 1, a metal interconnect 16 connects the metal layer 17 to a gate 13 of a metal oxide semiconductor (MOS) transistor whose gate oxide is shown at 12 and whose channel extends through the semiconductor substrate illustrated generally at 11. The gate 13 is typically polysilicon. A pre-metal dielectric (PMD) stack 15 formed from phosphorus-doped tetraethyl orthosilicate (TEOS) deposited by chemical vapor deposition (CVD) is interposed between the gate 13 and the metal layer 17. An etch stop layer 14 (typically a semiconductive material) is used in a patterning and etching process associated with the positioning of the metal interconnect (gate contact) 16.

The plasma process used to deposit the IMD dielectric 18, for example a high-density plasma process such as the aforementioned FHDP process, is known to damage the gate oxide 12. This damage is commonly referred to as plasma process induced damage or PPID. On the other hand, high-density plasma process deposition has several advantageous features which are well known to workers in the art.

It is therefore desirable to provide for a reduction in the gate oxide damage caused by plasma process deposition of IMD layers.

SUMMARY OF THE INVENTION

According to exemplary embodiments of the invention, PPID can be reduced by reducing electric charge accumulation on the gate during the plasma process deposition of the IMD.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which:

FIGS. 2A and 2B are cross-sectional views of an integrated circuit according to exemplary embodiments of the invention;

DETAILED DESCRIPTION OF THE INVENTION

According to exemplary embodiments of the invention, a characteristic of the conventional etch stop layer (see 14 in FIG. 1) is modified in order to correspondingly reduce PPID during deposition of the FHDP dielectric 18.

Figure 1:
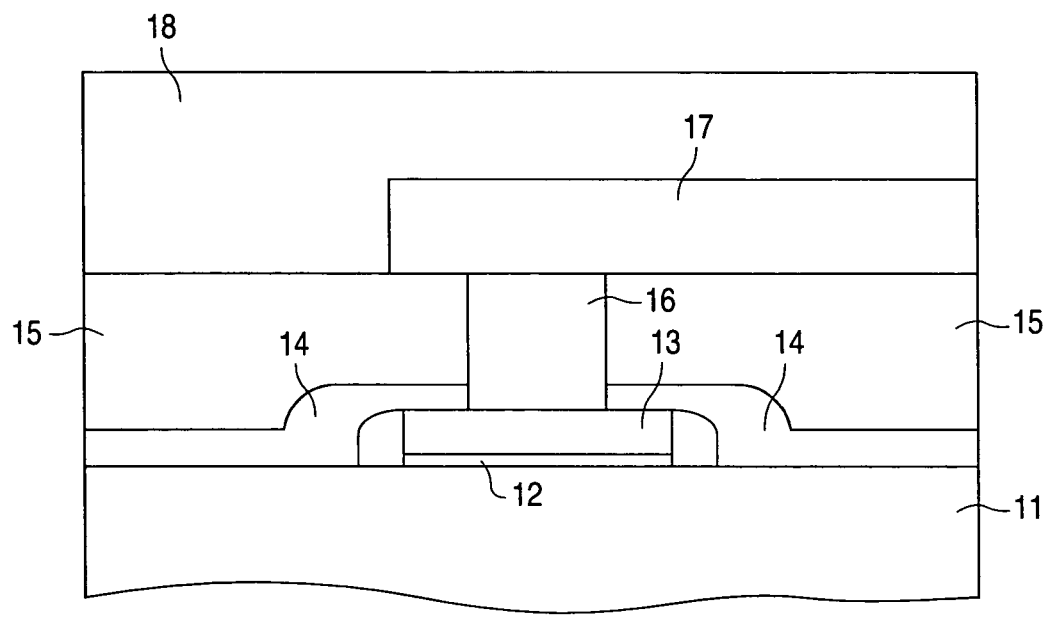
FIG. 1 is a cross-sectional view of an integrated circuit according to the prior art.
Figure 2A:
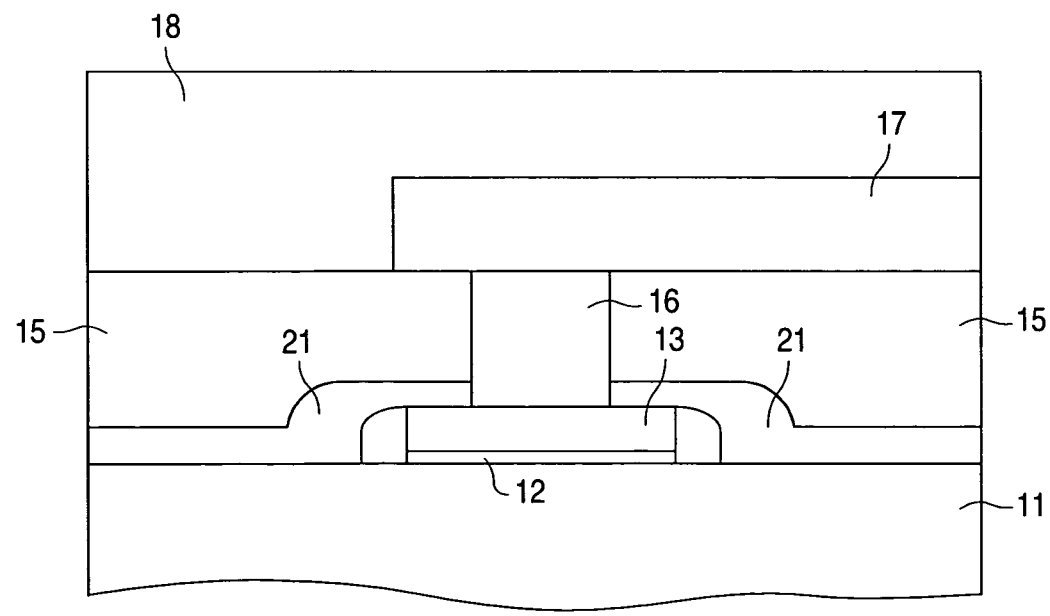

FIGS. 2A and 2B illustrate exemplary embodiments of the invention with an etch stop layer 21 that is suitably modified to correspondingly reduce PPID during FHDP deposition of the IMD 18. In some exemplary embodiments of the invention, all of the remaining structure of the integrated circuit is the same as the corresponding structure of prior art FIG. 1.

In some exemplary embodiments, the refractive index (RI) of the etch stop layer 21 is increased relative to the refractive index of the etch stop layer 14 of FIG. 1. For example, the refractive index and/or extinction coefficient of etch stop layer 21 is characterized in some exemplary embodiments by a refractive index n=2.15 and an extinction coefficient k=1.6, whereas conventional etch stop layers are typically characterized by a refractive index n=2.0 and extinction coefficient k=1.3. More generally, in various exemplary embodiments, the extinction coefficient, k, of the etch stop layer 21 ranges from approximately 1.50 to approximately 1.65.

The increased refractive index of the etch stop layer means that the etch stop layer 21 has an increased conductivity relative to the prior art etch stop layer 14. In some embodiments, the increased conductivity of etch stop layer can discharge electrical charge which, in the prior art example of FIG. 1, accumulates on the gate 13 during the plasma process deposition of IMD 18. By dissipating the charge from gate 13 and thereby reducing accumulation of charge on gate 13, the etch stop layer 21 effectuates a reduction in the PPID experienced by the gate oxide 12, whereas the gate oxide 12 of FIG. 1 experiences more PPID because a greater amount of electrical charge accumulates on the gate 13 of FIG. 1 than does on the gate 13 of FIGS. 2A and 2B.

In some exemplary embodiments, the refractive index/conductivity of the etch stop layer 21 is increased relative to that of the prior art etch stop layer 14 by providing an increased level of silicon in the etch stop layer 21. Prior art etch stop layers such as shown at 14 in FIG. 1 are typically semiconductive films such as silicon nitride or silicon oxynitride. In some embodiments, the etch stop layer 21 can therefore be a silicon-rich silicon nitride or silicon oxynitride film with a higher silicon content than in the prior art etch stop layer 14 of FIG. 1. In some exemplary embodiments, this increased silicon content in the etch stop layer 21 provides the etch stop layer 21 with an extinction coefficient k in the aforementioned range from approximately 1.50 to approximately 1.65. The higher silicon content in etch stop layer 21 gives the etch stop layer a higher conductivity than that of the prior art etch stop layer 14. Recognizing that increased conductivity in the etch stop layer 21 creates an additional transistor leakage component, some embodiments set the silicon content of etch stop layer 21 appropriately to effectuate an acceptable trade-off between PPID reduction and device leakage.

FIG. 2B differs from FIG. 2A in the inclusion of a silicon-rich oxide liner 22 between metal layer 17 and fluorine doped high-density plasma oxide 18. This oxide liner 22 deposited directly under the fluorine doped high-density plasma oxide 18 protects the metal layer 17 during bulk deposition of oxide 18 and significantly reduce PPID-induced leakage. However, oxide liner 11 can also adversely affect the gap-fill properties of the fluorine doped high-density plasma oxide 18.

Figure 3:
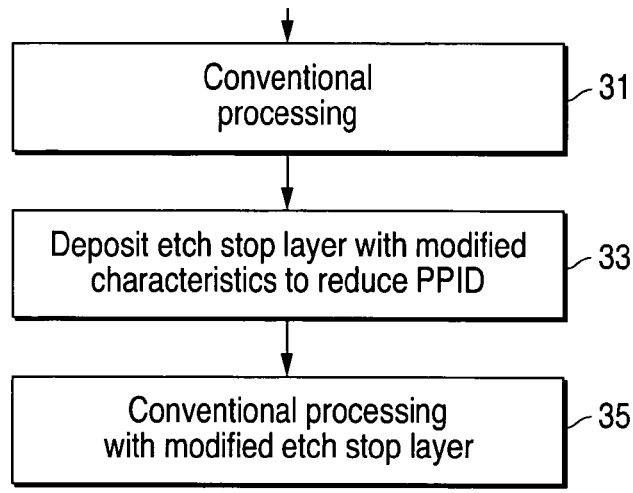
FIG. 3 illustrates exemplary operations according to the invention.

FIG. 3 illustrates exemplary integrated circuit fabrication operations according to the invention. As shown at 31, conventional fabrication techniques, such as those used to produce the prior art integrated circuit of FIG. 1, can be utilized until etch stop layer deposition. At 33, an etch stop layer with modified characteristics to correspondingly reduce PPID is deposited, for example, using the same conventional etch stop layer deposition technique as is used to deposit the prior art etch stop layer 14 of FIG. 1. Thereafter at 35, conventional fabrication techniques, for example the same techniques utilized after deposition of the prior art etch stop layer 14 in FIG. 1, are utilized in conjunction with the suitably modified etch stop layer.

Figure 4:
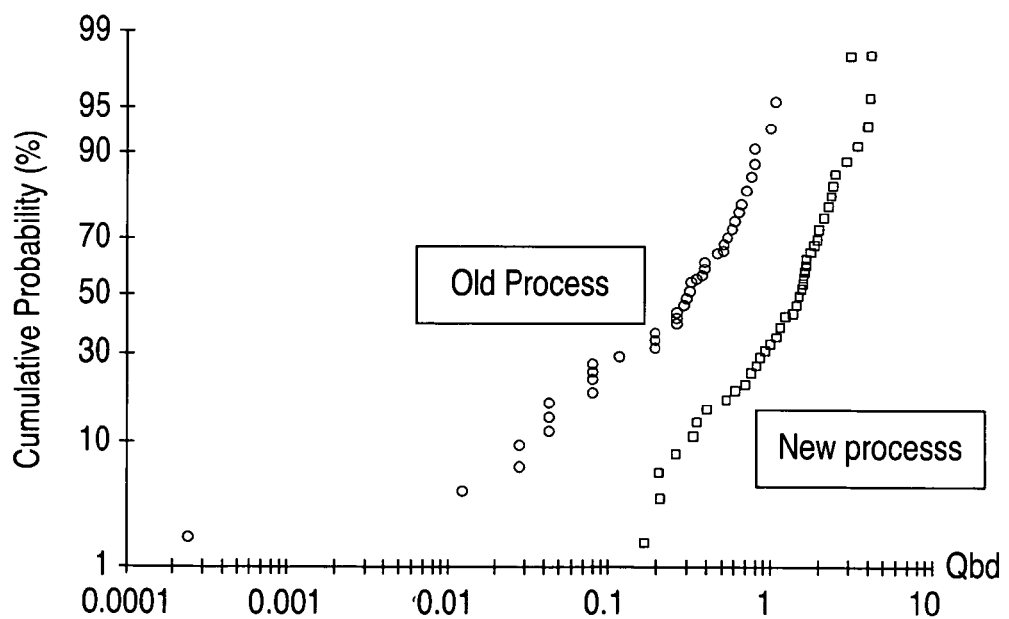
FIG. 4 graphically illustrates exemplary reductions in PPID achieved by exemplary embodiments of the invention.

FIG. 4 graphically illustrates an example of PPID reduction achieved by exemplary embodiments of the invention. FIG. 4 illustrates the cumulative distribution of charge-to-breakdown (Qbd) for the gate oxide of a PMOS transistor constructed using 0.18-micron CMOS technology. The "new process" data of FIG. 4, which corresponds to an exemplary embodiment of the invention, was produced using a silicon-rich silicon oxynitride etch stop layer. The "old process" data represents the prior art.

Referring again to the examples of silicon-rich silicon nitride and silicon oxynitride etch stop layers, and for a given silicon composition, the conductivity of the etch stop layer increases with increasing temperature. A typical back-end process temperature during conventional deposition of the FHDP dielectric 18 is about 400° C. This elevated temperature will therefore increase a silicon rich etch stop layer's ability to reduce PPID.

Although the present invention has been described with several embodiments, various changes and modifications may be suggested to one skilled in the art. It is intended that the present invention encompass such changes and modifications as fall within the scope of the appended claims.

What is claimed is:

1. An electrical circuit apparatus comprising:
a gate oxide on a substrate;
a gate electrode on the gate oxide;
a silicon nitride or silicon oxynitride etch stop layer over the gate electrode, wherein the etch stop layer has a refractive index of at least 2.15;
a fluorine doped high-density plasma oxide over the etch stop layer;
wherein the etch stop layer has an extinction coefficient value in a range from approximately 1.50 to approximately 1.65;
a dielectric layer between the etch stop layer and a metal layer electrically connected to the gate electrode; and
an oxide liner between the metal layer and the fluorine doped high-density plasma oxide.

2. The apparatus of claim 1, further comprising:
an opening through the dielectric layer and the etch stop layer over the gate electrode.

3. The apparatus of claim 2, further comprising:
a metal region within the opening between the gate electrode and the metal layer.

4. The apparatus of claim 2, wherein the dielectric layer is phosphorus-doped tetraethyl orthosilicate.

\* \* \* \* \*